United States Patent
Ausserlechner

(10) Patent No.: US 8,829,900 B2
(45) Date of Patent: Sep. 9, 2014

(54) LOW OFFSET SPINNING CURRENT HALL PLATE AND METHOD TO OPERATE IT

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 479 days.

(21) Appl. No.: 13/022,844

(22) Filed: Feb. 8, 2011

(65) Prior Publication Data

US 2012/0200290 A1    Aug. 9, 2012

(51) Int. Cl.
  *G01R 33/07*    (2006.01)
  *G01R 33/02*    (2006.01)

(52) U.S. Cl.
  USPC .................. 324/251; 324/207.2; 324/249

(58) Field of Classification Search
  USPC ........................................................ 324/251
  See application file for complete search history.

(56) References Cited

U.S. PATENT DOCUMENTS

| | | | | |
|---|---|---|---|---|
| 3,478,203 | A * | 11/1969 | Brown | 250/295 |
| 4,829,352 | A | 5/1989 | Popovic et al. | |
| 4,929,993 | A * | 5/1990 | Popovic | 257/424 |
| 6,278,271 | B1 | 8/2001 | Schott | |
| 7,339,245 | B2 | 3/2008 | Mueller | |
| 2005/0230770 | A1 | 10/2005 | Oohira | |
| 2006/0097715 | A1* | 5/2006 | Oohira et al. | 324/207.2 |
| 2007/0290682 | A1* | 12/2007 | Oohira et al. | 324/251 |

FOREIGN PATENT DOCUMENTS

| | | |
|---|---|---|
| CN | 101290946 A | 10/2008 |
| CN | 101770981 A | 7/2010 |
| DE | 10240404 A1 | 3/2004 |
| EP | 0947846 A2 | 10/1999 |
| FR | 2844882 A1 | 3/2004 |
| WO | 2006028426 A1 | 3/2006 |

OTHER PUBLICATIONS

Popovic, R.S., "Hall Effect Devices: Magnetic Sensors and Characterization of Semiconductors." 6 Pages.
U.S. Appl. No. 13/488,709, filed on Jun. 5, 2012. 36 Pages.
Notice of Allowance dated Jul. 21, 2014 for U.S. Appl. No. 13/488,709.

* cited by examiner

*Primary Examiner* — Bot Ledynh
(74) *Attorney, Agent, or Firm* — Eschweiler & Associates, LLC

(57) ABSTRACT

One embodiment of the present invention relates to a method and apparatus for removing the effect of contact resistances for Hall effect device contacts. In one embodiment, the apparatus comprises a Hall effect device comprising a plurality of force and sense contact pairs. The force and sense contact pairs comprise a force contact and a separate and distinct sense contact. The force contact is configured to act as a supply terminal that receive an input signal while the sense contact is configured act as an output terminal to provide an output signal indicative of a measured magnetic field value. By utilizing separate contacts for inputting a signal (e.g., an applied current) and reading out a signal (e.g., an induced voltage) the non-linearities generated by contact resistances may be removed, thereby minimizing the zero point offset voltage of the measured magnetic field.

20 Claims, 10 Drawing Sheets

LOW OFFSET SPINNING CURRENT HALL PLATE AND METHOD TO OPERATE IT

BACKGROUND OF THE INVENTION

Hall effect devices are often used in sensor applications for contactless sensing of magnetic fields. Hall effect devices find widespread use in many automotive and industrial applications. For example, in automotive applications a Hall effect device may be used to measure wheel speed in an automatic braking system (ABS) speed sensor, by measuring the speed of a magnet. In such an example, if a magnet approaches a Hall sensor then the Hall sensor will measure an increase in the magnetic field, therefore allowing the speed of the wheel to be detected.

Hall effect devices are solid state electron devices that operate in response to a magnetic field based upon the Hall effect principle, a phenomenon by which a voltage differential is generated across an electrically conducting body in the presence of a magnetic field. Conventional Hall effect devices typically comprise a planar structure, known as a Hall plate, which is configured to generate an output signal (e.g., either voltage or current) that is proportional to an applied magnetic field.

Hall plates have orthogonal axes, such that applying a current along one of the orthogonal axes causes a voltage to be generated along another orthogonal axis in the presence of a magnetic field. Typically, a Hall plate is operated by injecting a current into a first input, grounding a spatially opposed second input on the same axes, and measuring a voltage between inputs of an orthogonal set of axes. For example, as shown in FIG. 1, a current 104 may be applied across a two dimensional conductive Hall plate 102. According to the Hall principle, the presence of a magnetic field B causes the negative charge carrying particles of the current 104 to vary their motion (according to the right hand rule as shown at 106) and generate an induced voltage differential between nodes $V_1$ and $V_2$, which is proportional to the magnetic field B.

The integration of Hall effect devices (e.g., Hall plates) into semiconductor bodies (e.g., silicon substrate) has become common in many applications. One main problem of Hall effect devices is the zero point offset/error, which is a non-zero output signal (e.g., voltage, current) provided by the Hall effect device in the absence of a magnetic field (i.e., magnetic field equal to zero). The offset of Hall effect devices is caused by small asymmetries of the device caused by manufacturing tolerances or mechanical stress or thermo-electric voltages. In order to reduce/remove the offset errors experienced by a Hall effect device, the Hall effect device may be configured to take readings along different orientations of the device. Such methods, known as "current spinning", send current through a Hall effect device in different directions and combine the output signals in a manner which reduces the offset. For example, a Hall effect device may be rotated by 90° between measurements and then the average of the Hall output signals over a spinning cycle may be taken. While current spinning methods may reduce the offset errors (e.g. to 20 μT order of magnitude) such methods alone fail to completely remove the zero point error down to the noise level of 100 nT . . . 1 μT.

The cause of this residual zero point error is unclear. It can be proven that it must vanish for Hall effect devices with perfectly linear voltage-current-relationship. However, in modern CMOS technologies junction isolation techniques are used to isolate the Hall effect devices from other circuit elements on the same substrate. The width of the depletion layers associated with these reverse biased junctions depends on applied potentials and this leads to nonlinear current-voltage-characteristics of integrated Hall effect devices. The above stated small asymmetries of the Hall effect device are mixed up by the nonlinearity of the device and result in higher order offset error terms that cannot be eliminated by the spinning current principle. Therefore a method is sought to have a better control of the potentials inside the Hall effect device during a spinning current cycle.

DETAILED DESCRIPTION OF THE INVENTION

Figure 1:
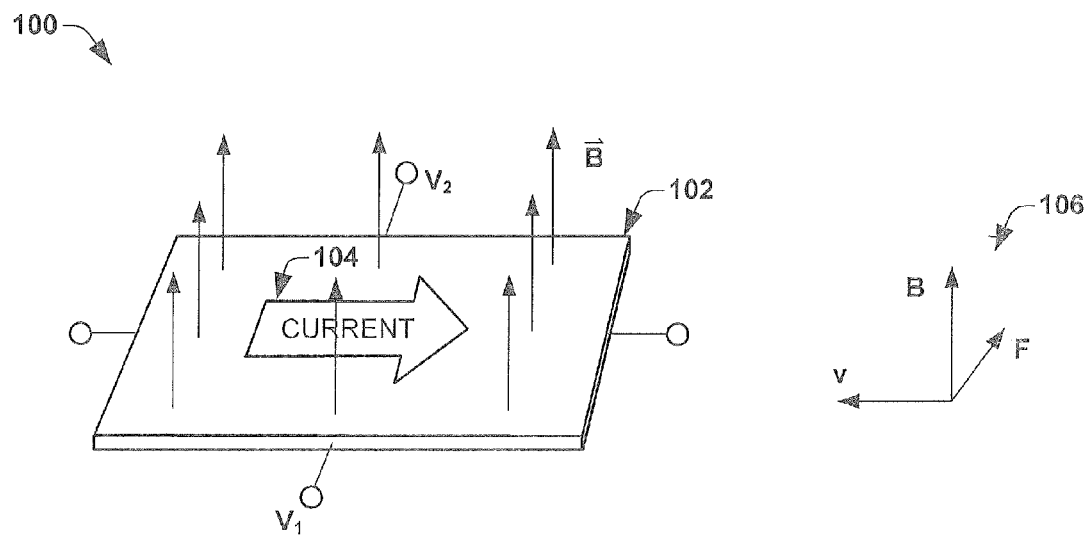
FIG. 1 illustrates a Hall plate, particularly showing the operating principle of Hall effect devices.

The present invention will now be described with reference to the attached drawing figures, wherein like reference numerals are used to refer to like elements throughout, and wherein the illustrated structures and devices are not necessarily drawn to scale.

The inventor has appreciated that the zero point error observed in integrated Hall effect devices may be related to the combination of nonlinear current-voltage-characteristics and contact resistances. For example, when a current is input into a Hall plate terminal, the current is subject to some non-zero contact resistance. The contact resistance can produce a zero point offset/error signal that a spinning current sequence does not remove.

Accordingly, a method and apparatus are provided herein for removing the effect of contact resistances from Hall effect device measurements. In one embodiment, the apparatus comprises a Hall effect device having a Hall plate comprising a plurality of force and sense contact pairs, wherein respective force and sense contact pairs comprise a force contact configured to be supplied with an input signal and a sense contact configured to provide an output signal indicative of a voltage potential of the contact pair. By utilizing separate contacts for inputting a signal (e.g., an applied current) and reading out a signal (e.g., an induced voltage) the effect of contact resistances may be substantially removed. For example, using a high impedance voltage measurement circuit (e.g., that applies a small current across the sense contacts) to measure the voltage from a sense contact allows for the voltage drop caused by the contact resistance to be minimized.

In one embodiment, the force and sense contact pairs may be coupled to one or more feedback circuits, configured to detect contact resistances and to correct the voltage drop across these contact resistances. In particular, respective feedback circuits may be configured to receive a sensed value from a sense contact. If the sensed value indicates a voltage drop between associated force and sense contacts, the feedback circuit can provide a feedback signal (e.g., current) at the force contact to adjust the voltage potential at the sense contact thereby defining any desired potential at the sense contact. The feedback signal generated by one or more feedback circuits may be measured and processed to generate a magnetic field value having a further reduced zero point offset.

Figure 2:
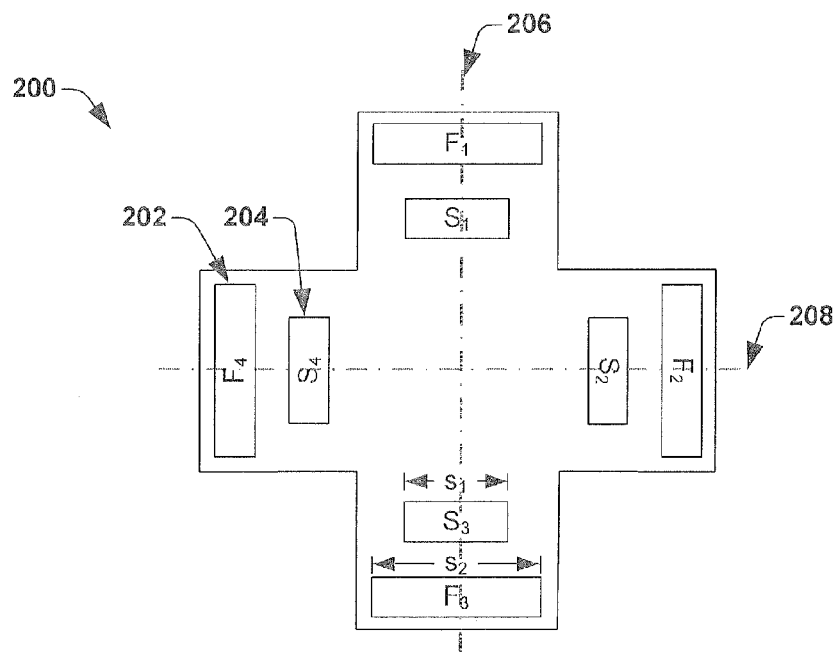
FIG. 2 illustrates a top view of a first embodiment of a lateral Hall plate comprising a plurality of force and sense contact pairs.

FIG. 2 illustrates a top view of a first embodiment of a Hall effect device 200 comprising a plurality of force and sense contact pairs (contact pairs), as provided herein. In particular, each contact pair comprises a force contact/terminal 202 and a separate and distinct sense contact/terminal 204. One or more force contacts 202 (e.g., $F_1$ and $F_3$) may be configured to receive an input signal (i.e., act as a supply terminal), while one or more sense contacts 204 (e.g., S2 and S4) may be configured to provide an output signal (i.e., act as an output terminal). Therefore, the use of force and sense contacts allows for separate contacts to be used for providing an input signal and for reading an output signal. It also allows for a signal (e.g., current) to be injected at a force contact (e.g., $F_1$) to control the voltage potential at an associated sense contact (e.g., $S_1$).

For example, during typical operation of the Hall plate an applied current may be generated, through a conductive path in an active region located between opposing contact pairs, by the injection of one or more signals (e.g., currents) into spatially opposed force contact supply terminals (e.g., injecting a first current into force contact $F_1$ and a second current into force contact $F_3$), while a Hall voltage indicative of an applied magnetic field can be measured across one or more orthogonal sense contact output terminals (e.g., reading a voltage from sense contact $S_2$ and sense contact $S_4$). Therefore, two force contact supply terminals can be supplied with an input signal, while at least one separate sense contact output terminal can provide an output signal indicative of a magnetic field acting on the Hall device.

Furthermore, in contrast to prior art Hall plates having two input terminals to supply the plate with electrical energy and two output terminals to provide an output voltage, the distinct force and sense contacts of Hall effect device 200 may comprise as many output signals as sense contacts. For example, as shown in FIG. 2, two sense contacts associated with the supply terminals (e.g., $S_1$ and $S_3$) can be used to measure output signals that provide voltage potentials within the active Hall region (e.g., that do not depend on the applied magnetic field), while two additional sense contacts (e.g., $S_2$ and $S_4$), associated with the output terminals provide an output signal (e.g., Hall voltage) that depends on an applied magnetic field. Therefore, the Hall effect device may provide output signals from both sense contact supply terminals and sense contact output terminals.

As shown in FIG. 2, the size of the force and sense contacts may vary in different embodiments. In one embodiment, the sense contacts $S_1$-$S_4$ may be smaller than the force contacts $F_1$-$F_4$. For example, as shown in FIG. 2, the size of sense contact $S_3$ is smaller in the lateral dimension than the size of force contact $F_3$ (e.g., $s_1 < s_2$). Making the sense contacts smaller than the force contacts reduces short circuit effects of the sense contacts to the Hall voltage, but increases the internal resistance seen between the sense contacts (e.g., which increases the noise of the Hall device). In one embodiment, the size of the sense contacts may be chosen to reach a balance between the short circuit effects and internal resistance.

The force and sense contact pairs may be symmetrically disposed over the Hall plate. For example, in one embodiment shown in FIG. 2, the Hall plate comprises four contact pairs having a 90° symmetry. In such an embodiment, a second contact pair is spatially oriented at 90° with respect to a first contact pair, a third contact pair is spatially oriented at 180° with respect to the first contact pair, and a fourth contact pair is spatially oriented at 270° with respect to the first pair. In other words, a line 206 between the centers of two opposing force and sense contact pairs configured to operate as supply terminal contact pairs is perpendicular to a line 208 between the centers of two opposing force and sense contact pairs configured to operate as output terminal contact pairs. In alternative embodiments, the Hall plate may comprise three contact pairs having a 120° symmetry, or more than four symmetric contact pairs (e.g., six contact pairs having a 60° symmetry, twelve contact pairs having a 30° symmetry, etc.).

Figure 3:
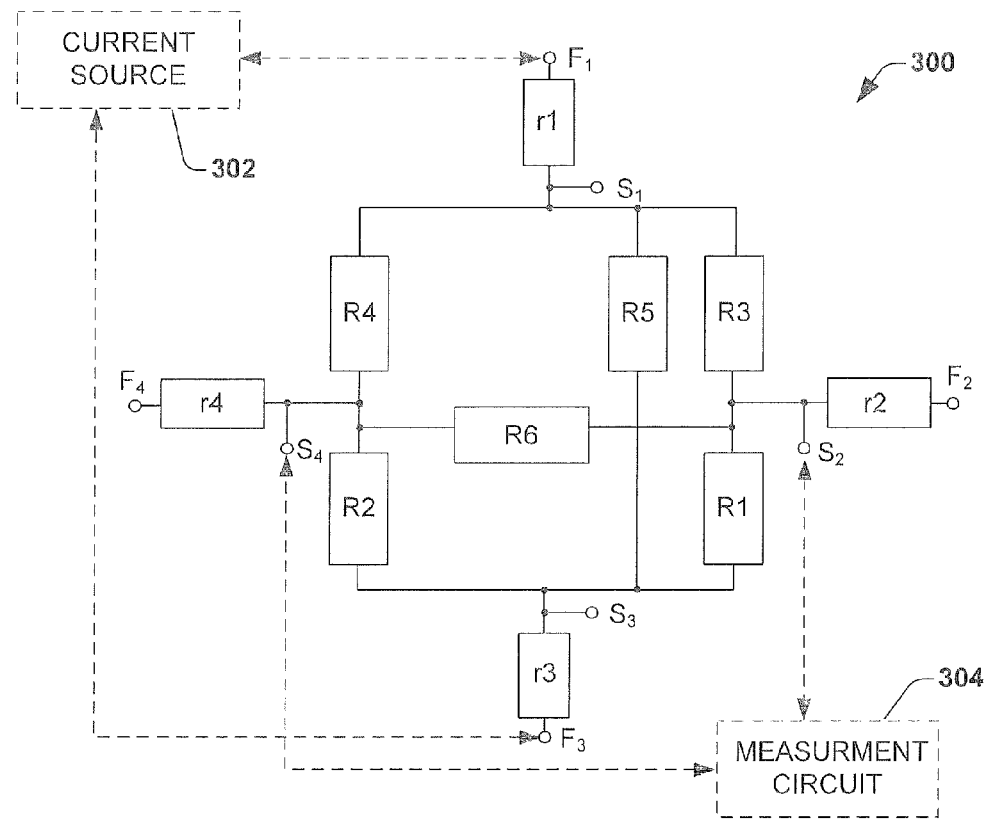
FIG. 3 illustrates an equivalent circuit diagram of the lateral Hall plate shown in FIG. 2.

FIG. 3 illustrates an equivalent circuit diagram 300 of the Hall plate of FIG. 2), showing contact resistances seen at the force and sense contacts. In particular, the circuit diagram 300 illustrates the resistance of the Hall plate as six Hall plate resistors R1-R6 arranged in a balanced bridge configuration. Resistors r1-r4 denote the contact resistances of the contacts.

The use of separate force contacts $F_1$-$F_4$ and sense contacts $S_1$-$S_4$ allows for voltage drops due to the contact resistances r1-r4 to be effectively avoided by making Hall voltage measurements through the sense contacts $S_1$-$S_4$ using a high impedance measurement device with low current. Therefore, as shown in FIG. 3, the sense contacts $S_1$-$S_4$ are shown as being "inside" of the force contacts $F_1$-$F_4$ since the sense contacts $S_1$-$S_4$ will not see the contact resistance r1-r4 during a Hall voltage measurement (i.e., the sense contacts $S_1$-$S_4$ will essentially avoid the contact resistance associated with each contact of the Hall plate).

Accordingly, although both force and sense contacts have associated contact resistances, using the sense contacts for high-impedance voltage measurements allows the sense contact resistances to be ignored in the measurement of an induced Hall voltage (illustrated in FIG. 3 by showing force contact resistances but not sense contact resistances). For example, in one embodiment applied current(s) may be provided by a current source 302 to opposing force contacts, $F_1$ and $F_3$, to generate an applied current within an active area of the Hall plate, which causes a potential difference between orthogonal opposing sense contacts $S_2$ and $S_4$ in the presence of a magnetic field. The use of separate force and sense contacts allows for the measurement of the potential difference to be performed between the orthogonal opposing sense contacts $S_2$ and $S_4$ using a high impedance voltage measurement circuit 304, thereby reducing/removing the voltage drop caused by the contact resistance (e.g., the voltage drop due to contact resistance seen by the high impedance voltage measurement circuit is small according to Ohms law V=IR, since the current is small due to the high impedance of the voltmeter). In other words, the measurement of an induced Hall voltage at sense contacts is minimally effected by the contact resistances since the current of the measurement is small.

Figure 4:
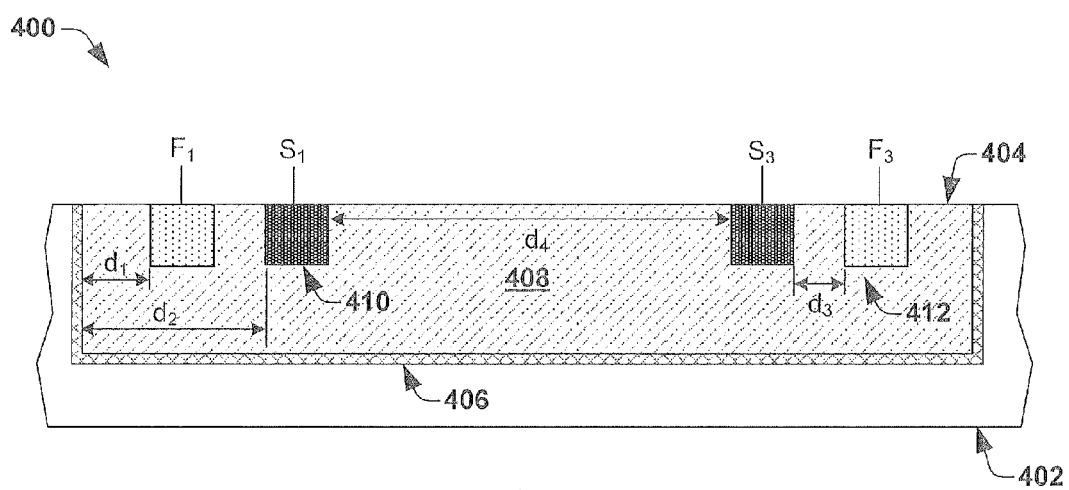
FIG. 4 illustrates a cross sectional view of the lateral Hall plate shown in FIG. 2.

FIG. 4 illustrates a cross sectional view of a Hall plate 400 having force and sense contact pairs (e.g., corresponding to the Hall plate of FIG. 2 and extending through contacts $S_1$, $F_1$ to $S_3$, $F_3$). It will be appreciated that the structure of the Hall plate illustrated in FIG. 4 is a non-limiting embodiment intended to illustrate the inventive concept provided herein. One of ordinary skill in the art will appreciate that variations on the Hall plate cross section are conceived as being included within the invention provided herein. For example, in an alternative embodiment a cross section of the Hall plate may comprise an n-type substrate having a small n-tub in a large p-tub, where the small n-tub is the Hall effect device and the junction isolation is either between small n-tub and the large p-tub, the large p-tub and n-substrate, or both.

Referring to FIG. 4, the Hall plate 400 comprises a tub 404 having a first doping type (e.g., lightly n-doped) that is formed within a conductive substrate 402 having a second doping type different than the first doping type (e.g., a p-doped region having $10^{15}$-$10^{16}$ dopants/cubic centimeter in CMOS). In various embodiments, the one or more tubs 404 may comprise an implantation of the substrate, a diffusion, or epitaxial layer. The opposite doping of the tubs 404 and the conductive substrate 402 may cause junction isolation of the tubs 404 from a remainder of the conductive substrate 402 when appropriate bias conditions are applied. The junction isolation result in electrical nonlinearities in the Hall plate.

For example, the tub 404 and conductive substrate 402 may be biased so as to cause the junction between the tub 404 and conductive substrate 402 to be reverse biased, resulting in a non-conducting depletion region/layer 406 that causes an isolating p-n junction that is non-conducting in one direction (e.g., a positive potential may be applied to the tub while the substrate is grounded). The size of the non-conducting depletion region/layer 406 may change based upon the size of the voltage applied across the isolation junction. For example, as the reverse-voltage applied across the isolation junction increases the size of the depletion layer 406 increases thereby causing electrical non-linearities in the Hall effect device.

Force and sense contact pairs (e.g., $F_1$ and $S_1$, $F_3$ and $S_3$, etc.) are located within the tub 404. In one embodiment, the force and sense contacts may be formed within highly doped contact implant regions having a higher doping than the tub 404. An active region 408 (where the Hall effect takes place) is positioned laterally between the force and sense contact pairs. The thickness of the tub 404 is usually about 4 µm with the force and sense contacts having a depth of between 1 µm to 2 µm. The width of the tub 404 is usually between 50 µm to 100 µm, with a spacing between the force contacts and sense contacts (e.g., between $F_1$ and $S_1$) being between 1 µm to 10 µm and a spacing between the sense contacts $S_1$ and $S_3$ being between 20 µm 100 µm.

Although FIG. 4 illustrates force contacts (e.g., $F_1$ and $F_3$) and sense contacts (e.g., $S_1$ and $S_3$) formed within the same implantation tub, one of ordinary skill in the art will be appreciated that the Hall effect device may comprise more than one tub, wherein the force and sense contact may be formed within different tubs. For example, the force contacts (e.g., $F_1$ and $F_3$) may be formed within a deeper tub than the sense contacts (e.g., $S_1$ and $S_3$).

In one embodiment, a force contact (e.g., $F_1$) of a force and sense contact pair may be disposed closer to perimeter of the Hall plate than an associated sense contact of the contact pair (e.g., $S_1$) (i.e., the sense contacts are closer to the center of the hall plate and the force contacts are closer to its perimeter). As shown in FIG. 4, the distance $d_1$ between the edge of force contact $F_1$ and the perimeter of the Hall plate is smaller than the distance $d_2$ between the edge of the sense contact $S_1$ and the perimeter of the Hall plate. Such placement of a force contact (e.g., $F_1$) allows for an applied current injected at the force contact to travel through the Hall plate. In an additional embodiment, the spacing between force and sense contacts $d_3$ (e.g., spacing between $F_3$ and $S_3$) of a contact pair is smaller than the spacing between sense contacts $d_4$ (e.g., spacing between $S_3$ and $S_1$) of two opposing contact pairs.

It will be appreciated that although FIGS. 2-4 illustrate a lateral Hall plate, that the lateral Hall plate configuration is a non-limiting embodiment of a Hall effect device that the present invention may be applied to. One of ordinary skill in the art will appreciated that the force and sense contact pairs provided herein may also be applied to other Hall effect devices (e.g., a vertical Hall effect device, for example, wherein the vertical Hall effect device is arranged to sense a magnetic field extending generally parallel to the surface of the device, as shown below in, FIGS. 11a-11d).

In additional embodiments, the effect of the contact resistance on a Hall effect device's zero point offset may be further reduced by specifically controlling the voltage potential at the sense contact output terminals of the Hall effect device through the use of one or more high impedance feedback circuits, configured to detect contact resistances and to correct the voltage drop across these contact resistances. In one embodiment, the one or more feedback circuits are coupled to one or more force and sense contact pairs and are configured to sense a voltage potential value at a sense contact and to provide feedback signals (e.g., currents) to an associated force contact, wherein the feedback signal defines the voltage potential at the sense contact. Measurement of the feedback signals essentially allow for a measurement of the induced Hall voltage without "seeing" voltage drops caused by the resistance of the contacts.

For example, the resistance of a force contact causes current flowing across the force contact to lead to a poorly defined voltage drop. Using the sense contacts, a high impedance feedback circuit can detect this poorly defined voltage and provide a feedback signal that may add the small voltage drop back to generate a well defined potential. For example, to supply the Hall plate with 2V, a 2V potential may be applied at force contact $F_1$. However, due to the resistance of the force contact, the high impedance feedback circuit may measure the potential at an associated sense contact $S_1$ of +1.9V (because 0.1V got lost across the contact resistance of the force contact). The feedback circuit can provide a feedback signal at the force contact $F_1$ that accounts for the contact resistance so that the sense contact $S_1$ will have the desired 2V potential.

Accordingly, in additional embodiments, the feedback signal generated by one or more output terminal feedback circuits may be measured over a current spinning cycle and processed to further remove zero point offset voltages caused by the residual effects of contact resistance remaining in a Hall effect device using force and sense contact pairs. FIGS. 5a-8b illustrate various feedback circuit configurations that may be used to further remove a Hall effect device's zero point offset by actively controlling the voltage potential at various sense contacts of the Hall effect device (e.g., Hall plate). In particular, the FIGS. 5a-8b illustrate different configurations that enable various operation modes (e.g., common-mode operation, differential operation, etc.) for a Hall effect device.

Figure 5A:
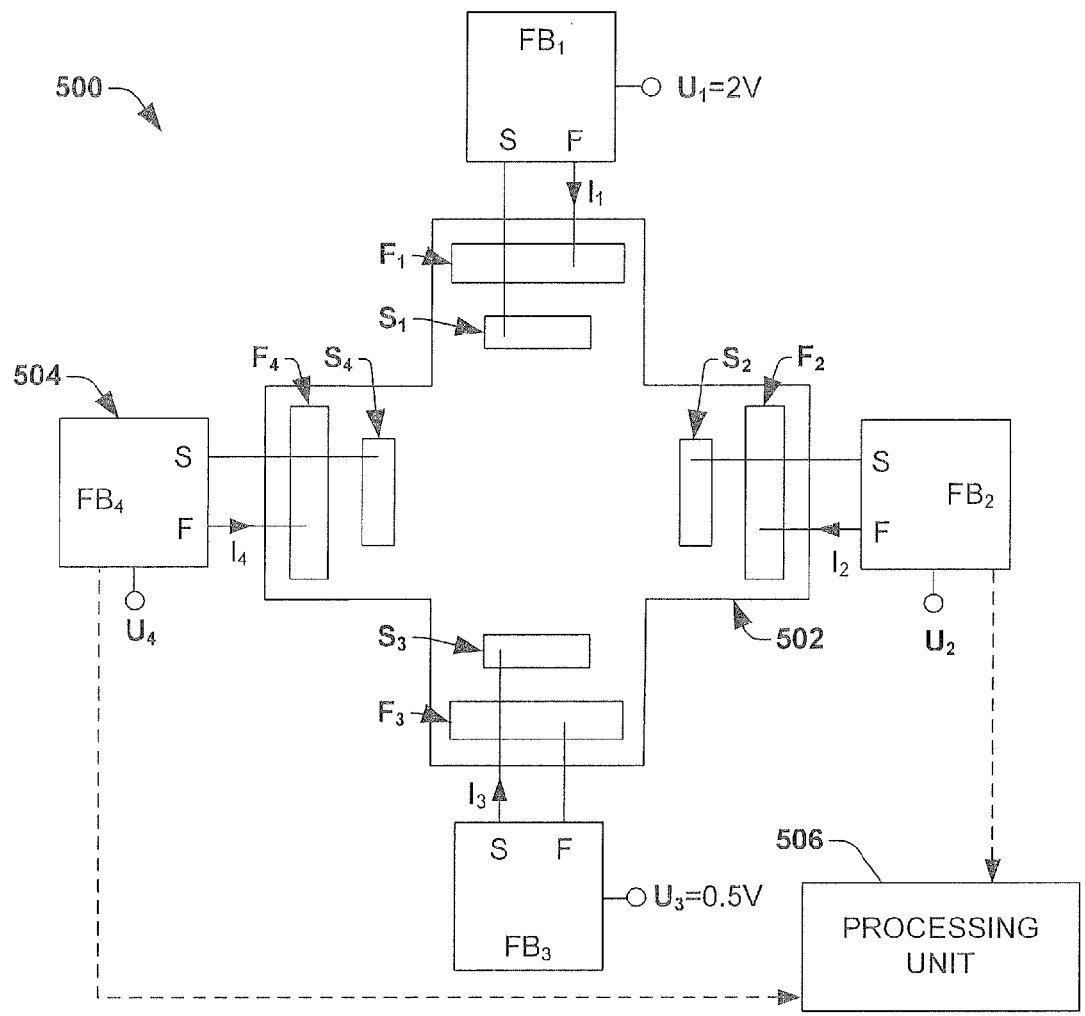
FIG. 5a illustrates a Hall plate having a plurality of dedicated feedback circuits coupled to respective force and sense contact pairs to regulate the potential at the sense contacts.

It will be appreciated that FIGS. 5a-8b illustrate a single clock phase of a current spinning cycle. Over a complete current spinning cycle the illustrated reference potentials and/or feedback circuit connections may be cycled to change the applied and induced current over a over a 360° rotation. For example, FIG. 5a illustrates the reference potential values (e.g., $U_1=2V$, $U_3=0.5V$) at a first clock cycle 1, while at a second clock cycle 2 the reference potentials may be rotated by 90° (e.g., so that $U_2=2V$ and $U_4=0.5V$), and at third clock cycle 3 the reference potentials may be rotated by 180° (e.g., so that $U_3=2V$ and $U_1=0.5V$), and at a fourth clock cycle 4 the reference potentials may be rotated by 270° (e.g., so that $U_4=2V$ and $U_2=0.5V$). Furthermore, it will be appreciated the sequence of clock cycles (e.g., clock cycles 1, 2, 3, 4) may be reversed to clock cycles 4-3-2-1 or may be changed to clock cycles 1-3-2-4, clock cycles 1-3-4-2, or even a stochastic reassignment to eliminate thermo-electric errors. One may also use several Hall effect devices with different sequences of clock cycles for better suppression of zero point offset voltages.

In one embodiment, shown in FIG. 5a, a Hall effect device 500 may comprise a plurality of feedback circuits 504 coupled to respective force and sense contact pairs of a Hall plate 502 to regulate the voltage potential at the sense contacts at well defined values (e.g., the potential at sense contact $S_1$ is controlled by dedicated feedback-circuit $FB_1$, the potential at sense contact $S_2$ is controlled by dedicated feedback-circuit $FB_2$, etc.). In particular, by coupling the feedback circuits 504 to a force contact and a sense contact pair (e.g., coupling a high impedance feedback circuit input node to one or more sense contacts and a feedback circuit output node to one or more force contacts), a feedback loop is formed that provides a feedback signal (e.g., feedback current $I_n$, where n=1, 2, 3, 4) to a force contact in order to keep the voltage potential at an associated sense contact at a well defined voltage potential value. For example, feedback circuit $FB_1$ may be configured to provide a feedback current $I_1$ to a force contact $F_1$ in order to keep the electrical potential at an associated sense contact $S_1$ at a well defined voltage potential. Such a feedback circuit configuration allows for control of the differential voltage and/or the common-mode voltage between the orthogonal spatially opposed sense contacts output terminals.

Since each contact pair comprises distinct force and sense contacts, each sense contact may provide an output signal to an associated feedback circuit. For example, as shown in FIG. 5a, sense contacts $S_1$ and $S_2$, associated with the supply terminals, can be used to measure output signals that provide output potentials within the active Hall region (e.g., that do not depend on the applied magnetic field) to associated feedback circuits $FB_1$ and $FB_3$. Sense contacts $S_2$ and $S_4$, associated with the output terminals, provide an output a signal that depends on the applied magnetic field.

In one embodiment, two of the feedback circuits may be configured to achieve well defined voltage potentials at spatially opposed supply terminals, while two additional feedback circuits may be configured to achieve well defined voltage potentials that are substantially the same for orthogonal spatially opposed output terminals. For example, if reference potentials $U_1$ and $U_3$ are set to different values (e.g., reference potential $U_1=3V$, reference potential $U_3=0.5V$) feedback circuits $FB_1$ and $FB_3$ will respectively provide currents $I_1$ and $I_3$ to force contacts $F_1$ and $F_3$, to drive associated sense contacts to a different voltages that causes an applied current to flow in the active region of the Hall effect device (e.g., from $S_1$ to $S_3$).

In the absence of a magnetic field, the voltage potential at the sense contacts $S_4$ and $S_2$ are at the same potential. However, the presence of a magnetic field the applied current generates an induced voltage that causes the voltage potentials at sense contacts $S_2$ and $S_4$ to be different. If the voltage potentials at $S_2$ and $S_4$ are controlled to be identical in the presence of a magnetic field, the feedback circuits $FB_2$ and $FB_4$ will respectively provide feedback currents $I_2$ and $I_4$ to achieve the identical voltage potentials.

In one embodiment, a processing unit 506 may measure the difference between the feedback currents applied to the orthogonal spatially opposed output sense contacts (e.g., $I_2$ and $I_4$), over a spinning cycle, to effectively remove the effect of the residual zero point offset due to contact resistances. In particular, the difference between the feedback currents, $I_2$ and $I_4$, provided to spatially opposed sense contacts is essentially linearly dependent (i.e., wherein linearly dependent means $(I_4-I_2)=k*B+c$, where B is the magnetic field, k is a constant, and c is the offset) so that the difference between feedback currents, $I_2$ and $I_4$, can be measured and processed (e.g., subtracted) over a full spinning cycle to provide for a magnetic field measurement having a reduced zero point offset.

Figure 5B:
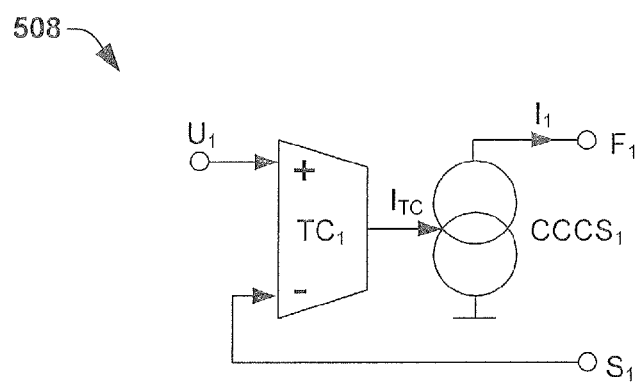
FIG. 5b illustrates an exemplary feedback circuit comprising a transconductance input stage and Current Controlled Current Source.

FIG. 5b illustrates an exemplary feedback circuit 508 (e.g., corresponding to feedback circuit $FB_1$ in FIG. 5A) comprising a transconductance input stage $TC_1$ and Current Controlled Current Source $CCCS_1$. The transconductance input stage $TC_1$ comprises a positive non-inverting input (+) and a negative inverting input (−). The transconductance input stage $TC_1$ is configured to output a current $I_{TC}$ that is proportional to the voltage between its non-inverting (+) and inverting (−) inputs. If the voltage at the non-inverting input is positive against the inverting input, the output current is positive. If the voltage at the non-inverting input is negative against the inverting input, the output current $I_{TC}$ is negative.

The output current $I_{TC}$ of the transconductance stage $TC_1$ is provided to $CCCS_1$, which outputs a feedback current $I_1$ to a force contact $F_1$ to drive the voltage potential at an associated sense contact to the reference voltage potential $U_1$ (e.g., feedback current $I_1$ is provided to $F_1$ to drives the voltage potentials at $S_1$ to be equal to $U_1$). If $TC_1$ comprises a large factor of proportionality, a small voltage difference between the inverting inputs can provide a large output current to $CCCS_1$, since $I_1$ is proportional to current and is independent of the contact resistance to which the current is supplied.

Therefore, during operation if the voltage potential at a sense contact (e.g., $S_1$) is lower than the reference or target voltage potential of the feedback circuit (e.g., $U_1$), the feedback circuit (e.g., $FB_1$) injects a large positive current (e.g., $I_1$) into the a force contact (e.g., $F_1$) of the Hall effect device to raise the potential at the sense contact (e.g., $S_1$) until it is equal to the reference voltage (e.g., $U_1$). Similarly, if the voltage potential at a sense contact (e.g., $S_1$) is higher than the reference or target voltage potential of the feedback circuit (e.g., $U_1$), the feedback circuit (e.g., $FB_1$) drastically reduces its output current supplied to a force contact (e.g., $F_1$) of the Hall effect device, thereby lowering the potential at the sense contact (e.g., $S_1$) until it is equal to the reference voltage (e.g., $U_1$).

In one embodiment, the reference voltage potential may be chosen to guarantee that a feedback circuit sources a current to the force contacts. For example, if feedback circuits $FB_1$ and $FB_3$ are configured to respectively have reference potentials $U_1=2V$ and $U_3=0.5V$, at zero magnetic field a nonlinear Hall plate may have a voltage potential of 1.1V at $S_2$ and $S_4$. A standard deviation of an offset voltage at zero magnetic field of 1.3 mV (e.g., a six-sigma value of 7.8 mV) and a maximum voltage swing measurable between $S_2$ and $S_4$ of 20 mV, due to maximum applied magnetic field, provide for a potential at $S_2$ and $S_4$ having an upper limit of 1.1V+(7.8 mV+20 mV/2)=1.1178 V. Therefore, choosing $U_2$=$U_4$=1.2 V causes $CCCS_2$ and $CCCS_4$ to source current.

Figure 6:
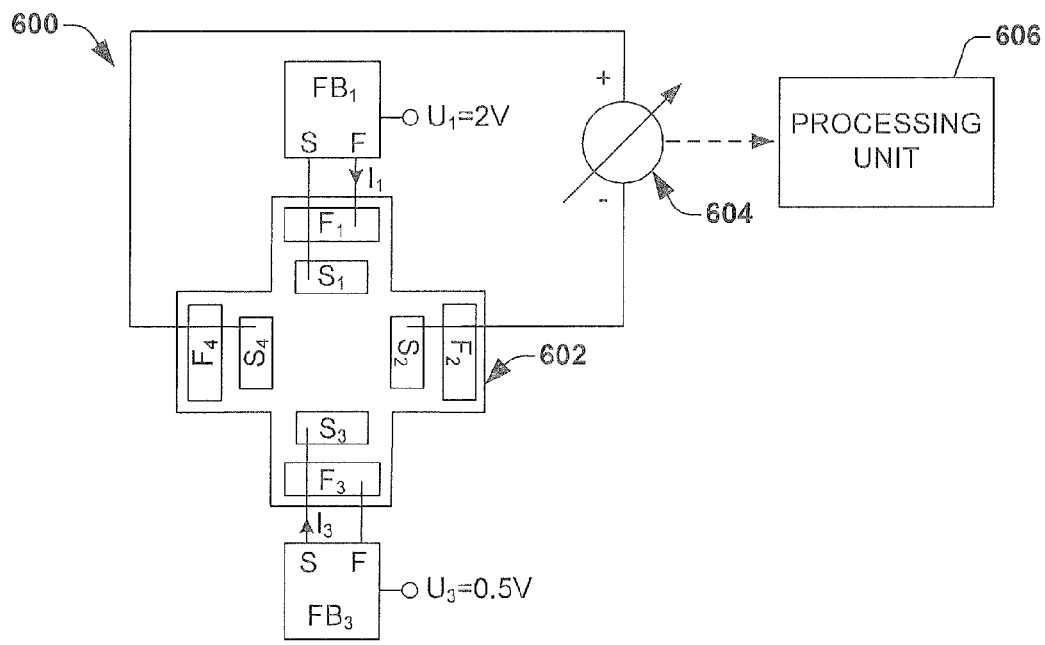
FIG. 6 illustrates a Hall plate having a feedback circuit configuration, wherein feedback circuits are configured to provide currents at opposing supply force contacts to keep the voltage potential at opposing output sense contacts at a well defined value.

FIG. 6 illustrates an alternative embodiment of a Hall plate feedback circuit configuration 600, wherein two feedback circuits, $FB_1$ and $FB_3$, are coupled to spatially opposed force and sense contact pairs. Feedback circuits $FB_1$ and $FB_3$ are configured to source current to opposing force contact supply terminals to set the voltage potentials at $S_1$ greater than the voltage potential at $S_3$ (e.g., $U_1$=3V, $U_3$=0.5V), thereby causing the feedback circuits to generate an applied current that flows in the active region of the Hall plate. In particular, a feedback circuit $FB_1$ generates a feedback current $I_1$ that is provided to the force contact $F_1$ to keep the voltage potential at an associated sense contact $S_1$ at a first well defined value. Similarly, a feedback circuit $FB_3$ generates a feedback current $I_3$ that is provided to the force contact $F_3$ to keep the voltage potential at an associated sense contact $S_3$ at a second well defined value, smaller than the first well defined value. Since there are no feedback circuits coupled to $S_2$ and $S_4$, the Hall plate is left free to establish some voltage potential at $S_2$ and $S_4$. A measurement element 604 is configured to measure the voltage potential between $S_2$ and $S_4$. Measured voltages may be processed by a processing unit 606 configured to compute a magnetic field value from the measured voltage, over a full spinning cycle to compute a magnetic field with a reduced zero point offset.

Therefore, FIG. 6 uses feedback circuits to drive a current at the force contact supply terminals of the Hall device, in contrast to FIG. 5a, which uses feedback circuits in both force contact supply terminals and sense contact output terminals of the Hall device.

Figure 7A:
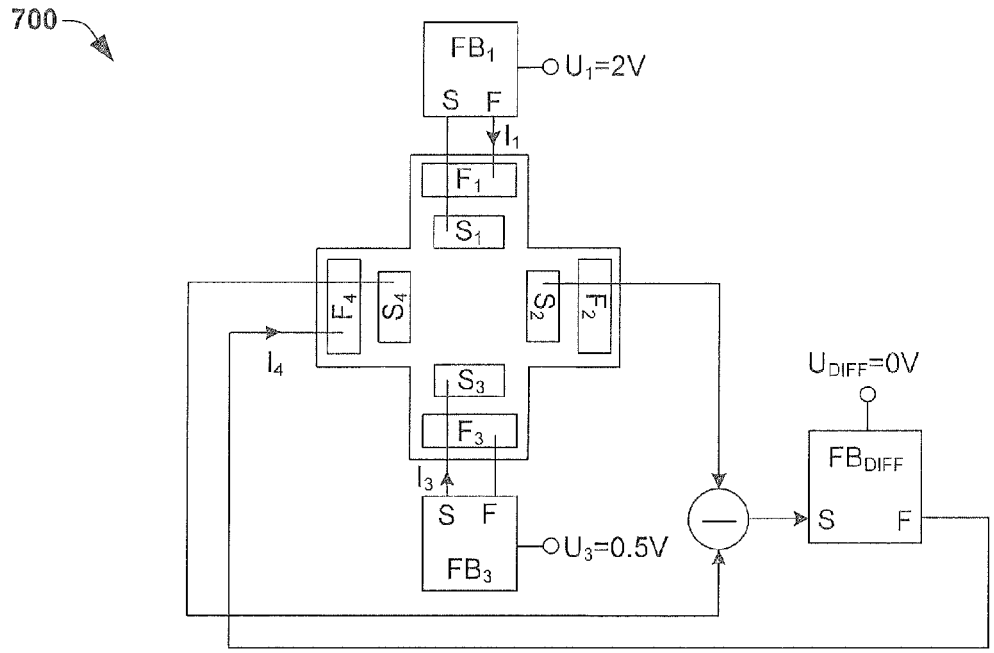
FIG. 7a illustrates a Hall plate having a feedback circuit configuration comprising a differential feedback circuit.

FIG. 7a illustrates another alternative embodiment of a Hall plate feedback circuit configuration 700 comprising feedback circuits configured to operate in a differential operating mode. As shown in FIG. 7a, feedback circuits $FB_1$ and $FB_3$ are coupled to spatially opposed force and sense contact pairs to generate an applied current in the active region of the Hall plate. A differential feedback circuit $FB_{DIFF}$ is configured to measure an induced voltage differential between sense contacts $S_2$ and $S_4$. Based upon the measured voltage differential, the differential feedback circuit $FB_{DIFF}$ is configured to generate a differential feedback current $I_4$ that is provided to force contact $F_4$, to control the voltage difference between sense contacts $S_2$ and $S_4$ so as to form a well defined voltage potential difference therebetween. Therefore, as shown in FIG. 7a the differential feedback circuit $FB_{DIFF}$ is configured to provide a differential feedback current $I_4$ that is proportional to the difference in voltage potential between sense contact $S_2$ and sense contact $S_4$ so that the voltage difference across $S_2$-$S_4$ is equal to 0 V. By measuring the differential feedback current output from the differential feedback circuit $FB_{DIFF}$ over a full spinning cycle, and processing the measured differential feedback currents, a magnetic field having a reduced zero point offset can be computed.

Figure 7B:
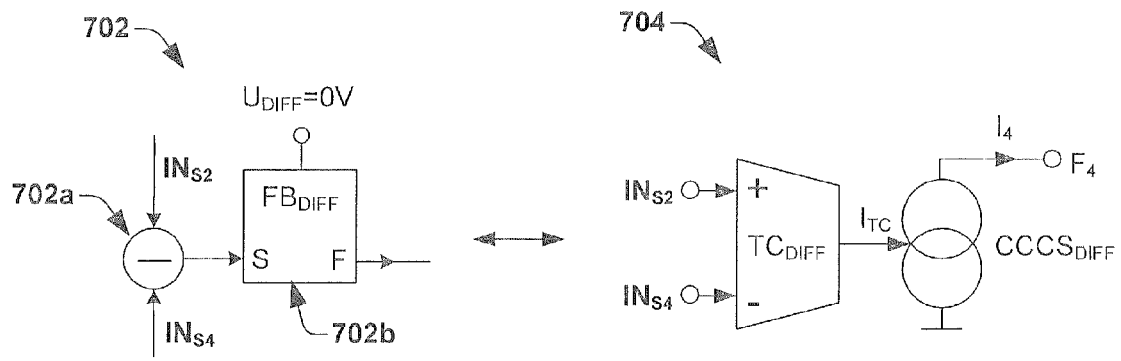
FIG. 7b illustrates an exemplary differential feedback circuit.

FIG. 7b illustrates an exemplary differential feedback circuit 704 corresponding to difference node 702a and feedback circuit 702b in FIG. 7a. As shown in FIG. 7b, the differential feedback circuit 704 may have a transconductance input stage $TC_{DIFF}$ that acts as a simple operational amplifier, such that the input signals received at the differential inputs, $IN_{S2}$ and $IN_{S4}$, comprise the voltage potential at sense contacts $S_2$ and $S_4$. The transconductance input stage $TC_{DIFF}$ outputs a current $I_{TC}$, proportional to the voltage between its differential inputs, to a Current Controlled Current Source $CCCS_{DIFF}$ that outputs a differential feedback current $I_4$ to a force contact $F_4$ to drive the differential voltage between sense contacts $S_4$ and $S_2$ to a reference value (e.g., $U_{DIFF}$)

Figure 8A:
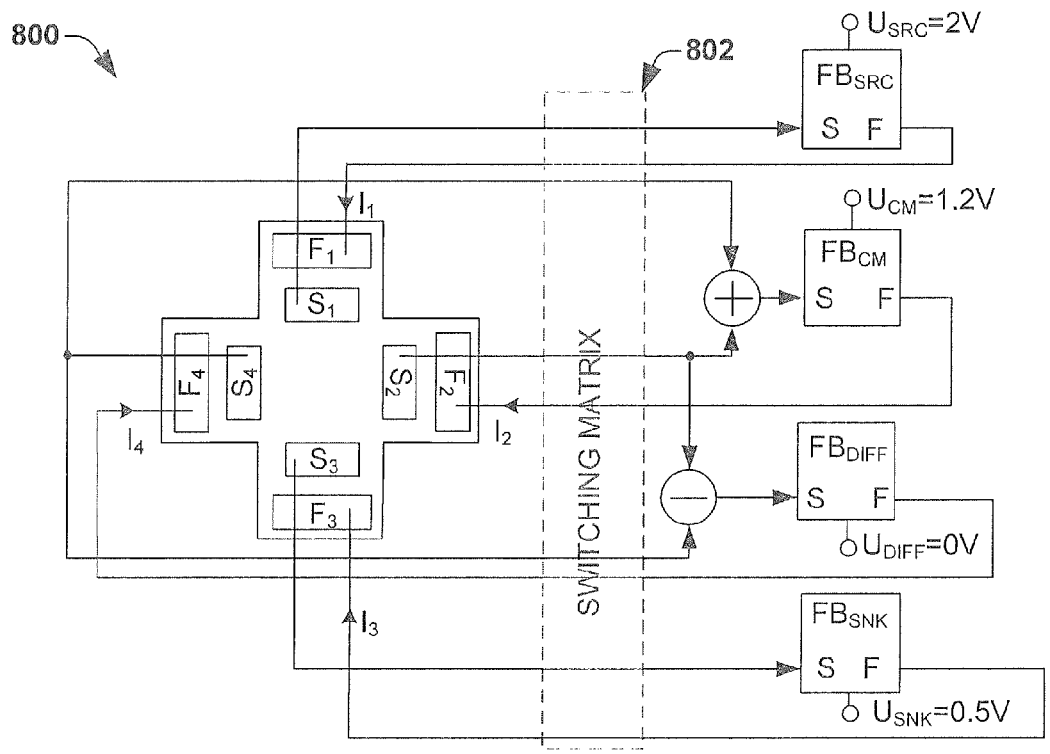
FIGS. 8a-8b illustrate additional alternative embodiments of Hall plate feedback circuit configurations, comprising feedback circuits respectively dedicated for a particular usage.
Figure 8B:
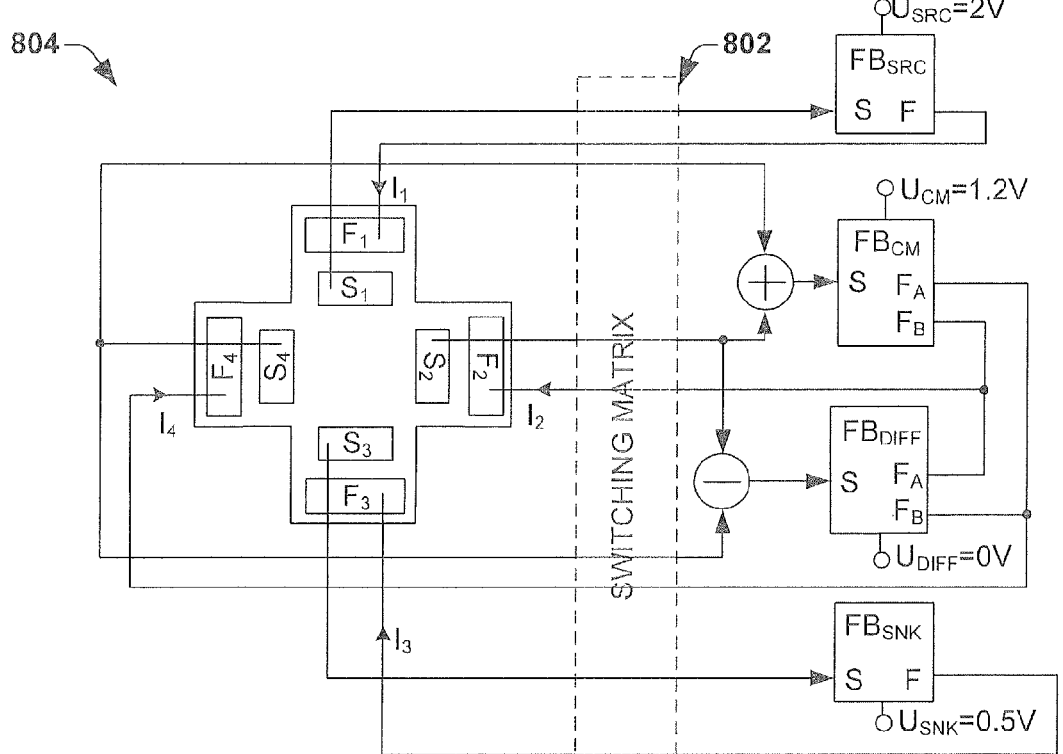

FIGS. 8a and 8b illustrate additional alternative embodiments of Hall effect device feedback circuit configurations, comprising feedback circuits respectively dedicated for a particular usage. In particular, FIGS. 8a and 8b illustrate a dedicated source-feedback circuit $FB_{SRC}$, a dedicated sink-feedback circuit $FB_{SNK}$, a dedicated common-mode feedback circuit $FB_{CM}$, and a dedicated differential feedback circuit $FB_{DIFF}$. The dedicated source feedback circuit $FB_{SRC}$ may be configured to generate a high-voltage feedback signal that drives a supply terminal contact pair of the Hall effect device to a high voltage. The dedicated sink-feedback circuit $FB_{SNK}$ may be configured to generate a low-voltage feedback signal that drives an opposite supply terminal contact pair of a low voltage. The dedicated common-mode-feedback circuit $FB_{CM}$ may be configured to generate a feedback signal that drives orthogonal output terminal contact pairs to mid-level voltage potential (e.g., ($S_2$+$S_4$)/2), while the dedicated differential feedback circuit $FB_{DIFF}$ may be configured to generate a feedback signal that drives orthogonal output terminal contact pairs to zero differential output voltage.

In such an embodiment, the Hall effect device feedback circuit configuration may further comprise a switch matrix 802 configured to connect the dedicated feedback circuits to contact pairs according to a sequence of clock cycles, so that each feedback circuit operates for its dedicated purpose. The use of dedicated feedback circuits may allow for optimization of the feedback circuits for their dedicated use. For example, the differential feedback circuit $FB_{DIFF}$, which determines the difference of currents used to force the voltage potential across orthogonal sense contacts to zero, may be optimized for low noise, whereas the other three feedback circuits are allowed to be less sensitive to noise.

Furthermore, during operation the use of dedicated feedback circuits may allow for the system to be operated in two ways: using the differential feedback circuit $FB_{DIFF}$ to control a difference in voltage (e.g., set differential feedback voltage=0 V) between orthogonal sense contact output terminals (e.g., $S_2$ and $S_4$), or to use the common-mode feedback circuit $FB_{DIFF}$ to control the absolute voltage (e.g., set common mode voltage potential=1.2 V) of the orthogonal sense contact output terminals.

For example, as shown in FIG. 8a, Hall effect device feedback circuit configuration 800 comprises a common-mode feedback circuit $FB_{CM}$ configured to receive the sum of voltage potentials at sense contacts $S_2$ and $S_4$. In one embodiment, the summation may be performed within the common-mode feedback circuit $FB_{CM}$. The common-mode feedback circuit $FB_{CM}$ divides the summation of voltage potentials by two and outputs a current $I_2$ that drives sense contacts $S_2$ and $S_4$ to a voltage potential equal to ($S_2$+$S_4$)/2 (i.e., sets $U_{CM}$=($S_2$+$S_4$)/2). Since $I_2$ may be positive or negative, the common mode feedback circuit is capable of generating a bipolar output current (i.e., is capable of sourcing and sinking output currents).

The differential feedback circuit $FB_{DIFF}$ is configured to receive the difference of voltages potentials at sense contacts $S_2$ and $S_4$ and to compare the difference to 0V. In one embodiment, the difference may be calculated within the differential feedback circuit $FB_{DIFF}$ (e.g., as shown in FIG. 7b). The differential feedback circuit $FB_{DIFF}$ then outputs a current $I_4$ that drives sense contacts $S_2$ and $S_4$ to a differential voltage potential of zero volts. Since $I_4$ may be positive or negative, the differential feedback circuit is capable of generating a bipolar output current (i.e., is capable of sourcing and sinking output currents).

FIG. 8b illustrates an alternative embodiment of a Hall effect device feedback circuit configuration 804 wherein each of the differential feedback circuit $FB_{DIFF}$ and common mode feedback circuit $FB_{CM}$ comprise two feedback outputs $F_A$ and $F_B$. The common-mode feedback circuit $FB_{CM}$ has two feedback outputs $F_A$ and $F_B$, configured to output identical feedback currents. The differential feedback circuit $FB_{DIFF}$ also has two feedback outputs $F_A$ and $F_B$, configured to output inverted outputs (e.g., $F_A=-F_B$). Therefore, if the differential feedback circuit $FB_{DIFF}$ sources a current at $F_A$ it sinks the same current at $F_B$, and vice versa.

Figure 9:
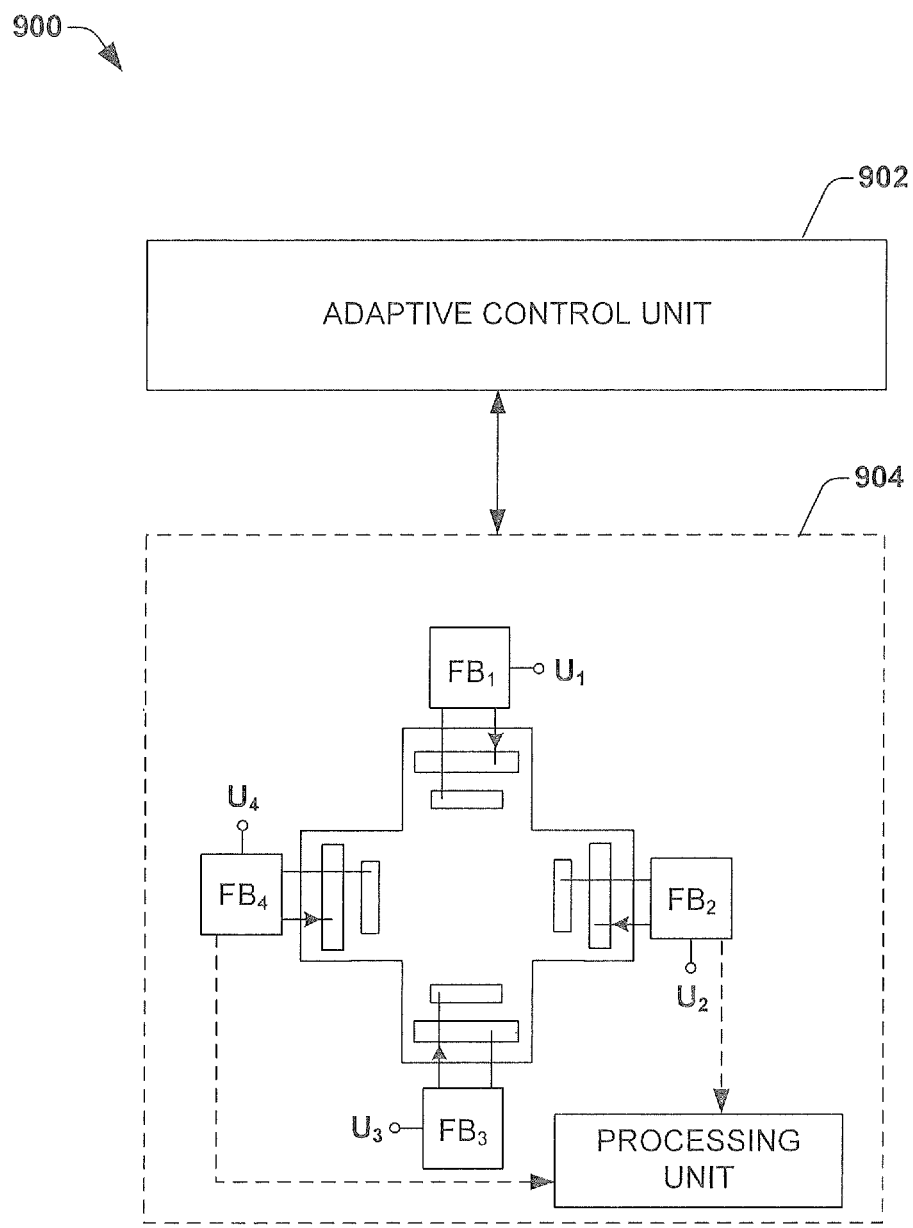
FIG. 9 illustrates an exemplary feedback circuit configuration wherein feedback circuits are controlled using an adaptive control unit to change one or more reference potential(s) during operation.

In one embodiment, the feedback circuits may be controlled using an adaptive control unit 902 to change the reference potential during operation, as shown in FIG. 9. In particular, the adaptive control unit 902 may be coupled to a Hall effect device feedback circuit configuration 904 (e.g., corresponding to the Hall effect device feedback circuit configurations shown in FIGS. 5a, 6, 7a, 8a, 8b) and is configured to control the reference potentials $U_x$ (x=1, ... 4) using some adaptive control techniques. For example, in one embodiment the adaptive control unit 902 can observe the average feedback currents that are injected into output contact pairs (e.g., into contact pairs 2 and 4 in the 1st and 3rd clock phases and into contact pairs 1 and 3 in the 2nd and 4th clock phases). The adaptive control unit 902 can then compute the time average over several full clock sequences (e.g. over 2 or 200 or 20000 cycles) and can adjust the reference potentials until the average feedback current into the output pairs is zero.

Figure 10:
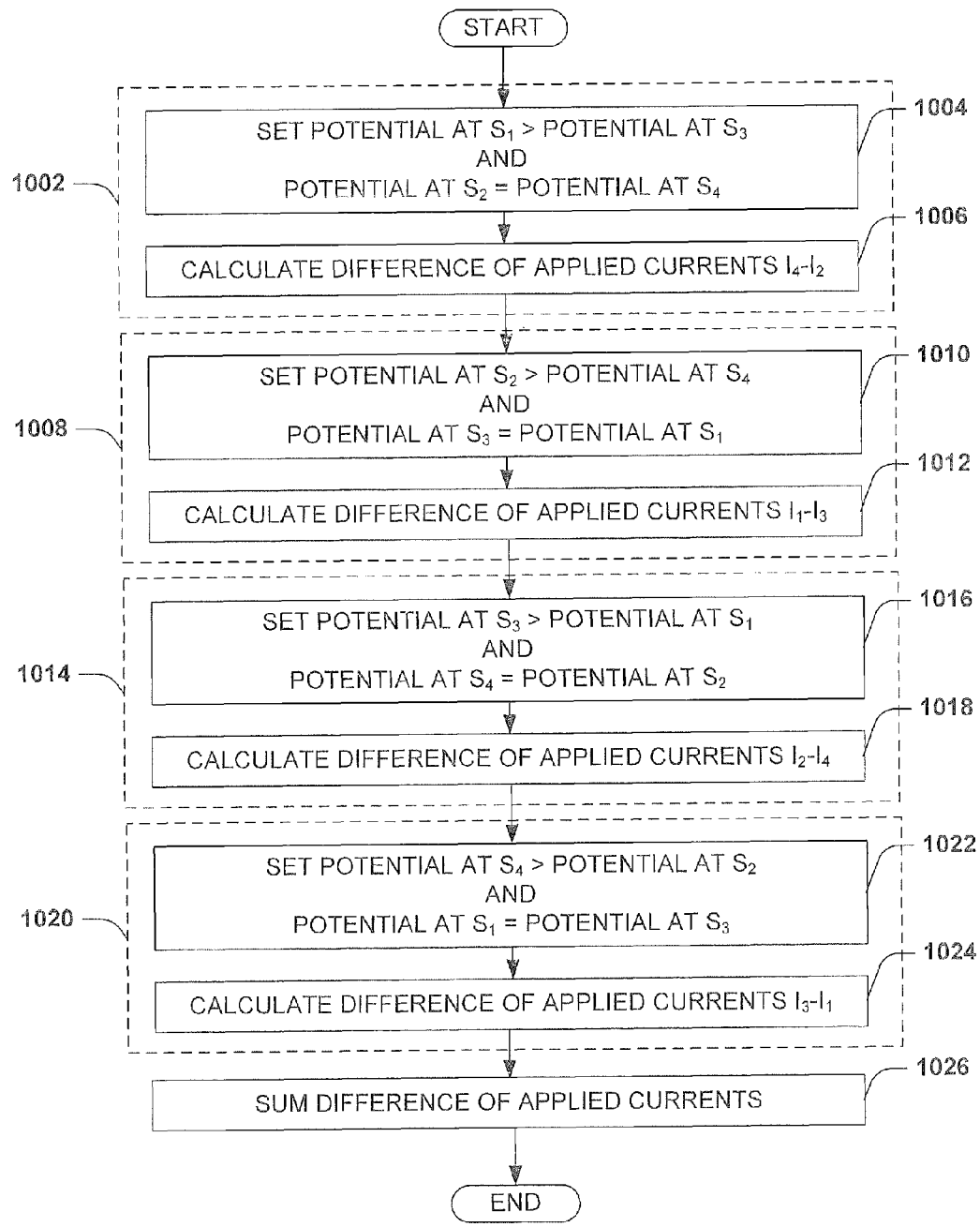
FIG. 10 illustrates a flow diagram showing an exemplary current spinning method.

FIG. 10 illustrates a flow diagram of an exemplary current spinning method for a Hall plate having a plurality of force and sense contact pairs, as provided herein, over a spinning cycle comprising a plurality of clock phases (e.g., clock phases 1002, 1008, 1014, and 1018). While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuit shown in FIG. 5a is non-limiting examples of circuits that may be used to implement method 1000). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

FIGS. 11a-11d illustrate exemplary cross sectional cartoons of a vertical Hall device 1100. Input and output terminals comprise contacts $F_1, S_1, \ldots S_4, F_4$, which are located at the surface of the die (e.g., with wires on top of them), while rectangle 1102 denotes the is lightly n-doped tub. The vertical Hall device 1100 has a geometry comprising a long narrow strip with the input and output terminals lined up at a single straight line and in alternating sequence, so that there is an input terminal between two output terminals (e.g., $F_2$ between $S_2$ and $S_3$) and vice versa (e.g., $S_2$ between $F_1$ and $F_2$). FIGS. 11a-11d shows a sequence of currents applied to the different force contacts of the vertical Hall device during the plurality of clock phases of method 1000, illustrating that the use of force-sense-contact pairs in a vertical Hall device.

Figure 11A:
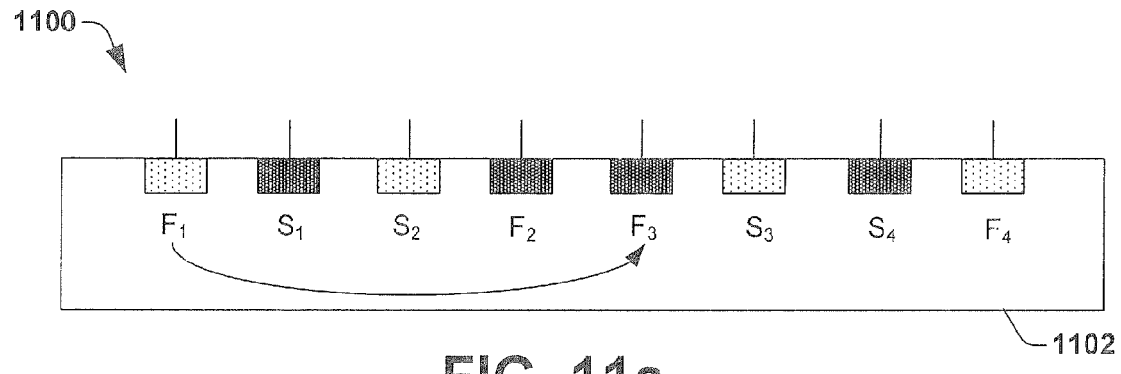
FIGS. 11a-d illustrates cross sectional cartoons of a vertical Hall device illustrating the sequence of currents applied to the different force contacts of the Hall device.

At 1004, during the first clock phase 1002, a voltage potential at sense contact $S_1$ is set to a value greater than a voltage potential at sense contact $S_3$, thereby resulting in a current flowing from force contact $F_1$ to force contact $F_3$, as shown in FIG. 11a. Furthermore, currents $I_2$ and $I_4$ are provided to force contacts $F_2$ and $F_4$, to set the voltage potential at sense contact $S_2$ equal to the voltage potential at sense contact $S_4$.

At 1006, during the first clock phase 1002, the difference between the applied currents, $I_4-I_2$, is calculated.

Figure 11B:
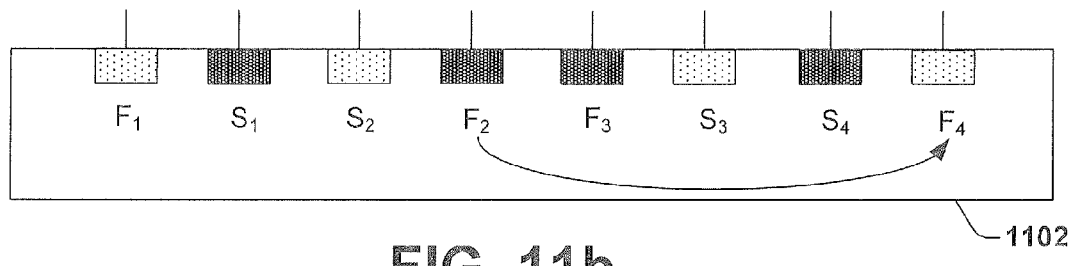

At 1010, during the second clock phase 1008, a voltage potential at sense contact $S_2$ is set to a value greater than a voltage potential at sense contact $S_4$, thereby resulting in a current flowing from force contact $F_2$ to force contact $F_4$, as shown in FIG. 11b. Furthermore, currents $I_3$ and $I_1$ are provided to force contacts $F_3$ and $F_1$, to set the voltage potential at sense contact $S_3$ equal to the voltage potential at sense contact $S_1$.

At 1012, during the second clock phase 1008, the difference between the applied currents, $I_1-I_3$, is calculated.

Figure 11C:
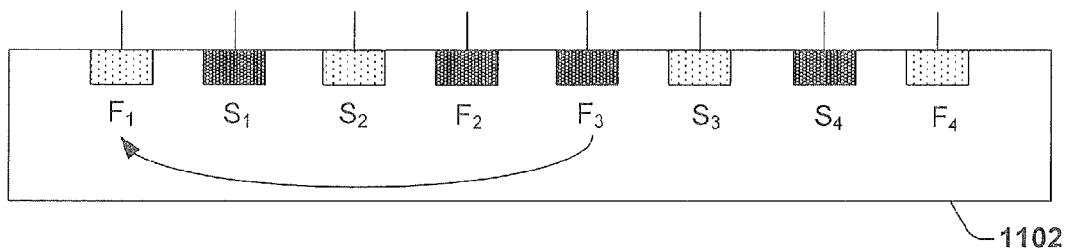

At 1016, during the third clock phase 1014, a voltage potential at sense contact $S_3$ is set to a value greater than a voltage potential at sense contact $S_1$, thereby resulting in a current flowing from force contact $F_3$ to force contact $F_1$, as shown in FIG. 11c. Furthermore, currents $I_4$ and $I_2$ are provided to force contacts $F_4$ and $F_2$, to set the voltage potential at sense contact $S_4$ equal to the voltage potential at sense contact $S_2$.

At 1014, during the third clock phase 1014, the difference between the applied currents, $I_2-I_4$, is calculated.

Figure 11D:
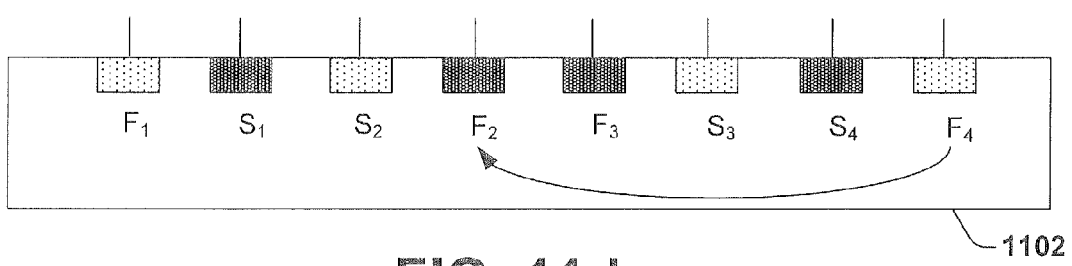

At 1022, during the fourth clock phase 1020, a voltage potential at sense contact $S_4$ is set to a value greater than a voltage potential at sense contact $S_2$, thereby resulting in a current flowing from force contact $F_4$ to force contact $F_2$, as shown in FIG. 11d. Furthermore, currents $I_1$ and $I_3$ are provided to force contacts $F_1$ and $F_3$, to set the voltage potential at sense contact $S_1$ equal to the voltage potential at sense contact $S_3$.

At 1024, during the fourth clock phase 1020, the difference between the applied currents, $I_3-I_1$, is linearly dependent to the contact resistance.

At 1026 the computed differences between the applied currents are summed (e.g., $(I_4-I_2)+(I_1-I_3)+(I_2-I_4)+(I_3-I_1)$). The summed difference is linearly dependent to the applied magnetic field and substantially vanishes (i.e., has an offset error below 1 μT) at zero magnetic field. In one embodiment, the supply voltages applied in clock phases 1002, 1008, 1014, 1020 are equal, which means the potential at $S_1$ of clock phase 1002=potential at $S_2$ of clock phase 1008=potential at $S_3$ of clock phase 1014=potential at $S_4$ of clock phase 1020; and the potential at $S_3$ of clock phase 1002=potential at $S_4$ of clock phase 1008=potential at $S_1$ of clock phase 1014=potential at $S_2$ of clock phase 1020. Therefore, as shown in FIGS. 10-11a-11d, a Hall effect device having one or more feedback circuits may reduce/remove a zero point offset by determining feedback currents in different orientations of the Hall effect device, the circuit can compute a signal that is linearly dependent to the applied magnetic field and that substantially vanishes at zero magnetic field.

Figure 12:
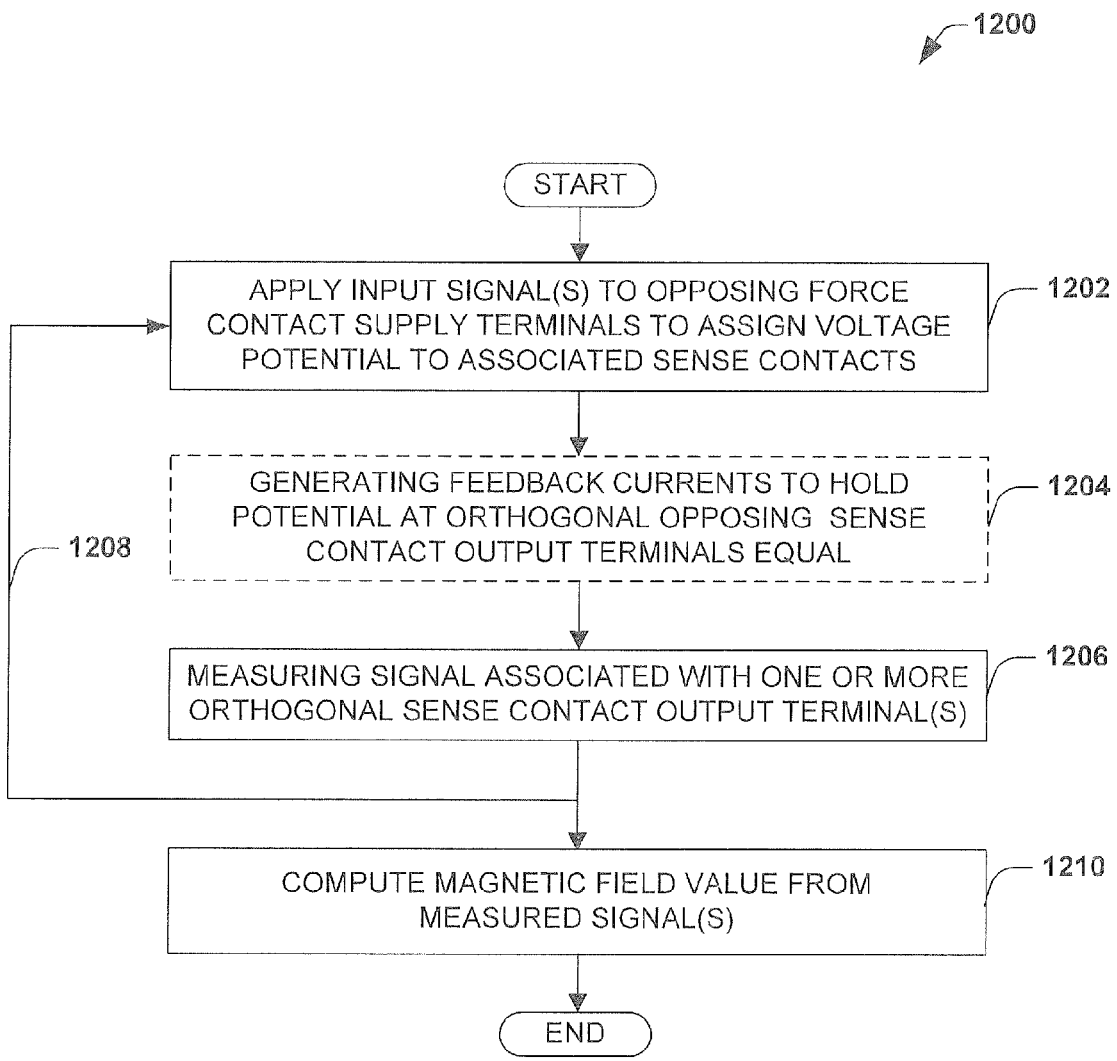
FIG. 12 illustrates a flow diagram showing a method for reducing the zero point offset of a Hall plate.

FIG. 12 illustrates a flow diagram of an exemplary method 1200 for reducing a zero point offset error of a Hall effect device.

At 1202 an input signal is applied to opposing force contact supply terminals, respectively comprised within spatially opposed force and sense contact pairs of a Hall effect device, to assign well defined voltage potentials to associated sense contacts of the Hall effect device. The well defined voltage potentials may be chosen so as to generate an induced current in an active region located between the spatially opposed force and sense contact pairs. In one embodiment the well defined voltage potentials may be assigned to be different at opposing force and sense contact pairs, causing an induced current to flow in an active region of the Hall effect device. In one embodiment, feedback circuits are configured to apply feedback signals to opposing force contact supply terminals to generate well defined voltage potentials at opposing force and sense contact pairs, causing an induced current to flow in an active region of the Hall effect device.

At 1204, the voltage potential of one or more orthogonal sense contact output terminals is optionally held at a well defined voltage potential. In one embodiment, one or more currents are output from one or more feedback circuits to orthogonal opposing sense contact output terminals to drive the voltage potential of the opposing sense contacts to a single well defined value.

At 1206 one or more output signals associated with one or more orthogonal sense contact output terminals of the Hall effect device are measured. The output signals associated the one or more orthogonal sense contact output terminals is proportional to an applied magnetic field. In one embodiment, the output signals may be measured directly from the sense contact output terminals of the orthogonal contact pairs (e.g., as shown in FIG. 3). In an alternative embodiment, the outputs signals may be measured from feedback current(s) output from one or more feedback circuits to the orthogonal contact pairs (e.g., as shown in FIG. 5a).

Line 1208 indicates that the method of steps 1202-1206 may be repeated multiple times, before proceeded to step 1210, when the method is used in a current spinning cycle. For example, in a Hall plate having contact pairs comprising a 90° symmetry, steps 1202-1206 will be repeated four times before proceeding to step 1210, while in a Hall plate having contact pairs comprising a 60° symmetry, steps 1202-1206 may be repeated six times before proceeding to step 1210.

At 1210 the measured signals are processed to compute a magnetic field value. In one embodiment the measured signals may comprise feedback currents measured over a spinning current cycle. In one embodiment, a computed difference between the feedback currents applied to opposing sense contact output terminals can be summed over a complete spinning cycle to achieve a magnetic field value.

The invention provided herein is typically illustrated and described with respect to lateral Hall plate configurations (e.g., in FIGS. 2, 5a 6, etc.). However, it will be appreciated that this is one non-limiting embodiment of a hall effect device to which the present invention may be applied. One of ordinary skill in the art will appreciate that the invention disclosed herein may be applied to various physical embodiments of Hall elements, which rely upon the Hall effect to detect a magnetic field. For example, although FIGS. 2-4 illustrates force and sense contact configurations with respect to a lateral hall plate, the inventive concept of the force and sense contacts may be applied to any Hall effect device (e.g., a vertical hall plate).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A Hall effect device, comprising:
a conductive substrate having a first doping type;
one or more tubs having a second doping type different than the first doping type;
a first plurality of force and sense contact pair comprising multiple force contacts and multiple sense contacts disposed along a first line;
a second plurality of force and sense contact pair comprising multiple force contacts and multiple sense contacts disposed along a second line intersecting the first line;
a plurality of feedback circuits coupled to the plurality of force and sense contact pairs and configured to control a voltage potential at a sense contact of a force and sense contact pair of the Hall effect device by providing one or more feedback signals to the force contact of the sense contact pair;
wherein processing measured feedback signals provided to a force contact of one or more output terminal contact pairs over a current spinning cycle provides a magnetic field value with a substantially zero point offset voltage; and
wherein respective force and sense contact pair comprise distinct force contacts and sense contacts located within the one or more tubs, and wherein respective force contacts are configured to provide electrical energy to the Hall effect device and respective sense contacts are configured to provide an output signal from the Hall effect device.

2. The hall effect device of claim 1,
wherein the first plurality of force and sense contact pair comprise a first force and sense contact pair and a second force and sense contact pair disposed along the first line;
wherein the second plurality of force and sense contact pair comprise a third force and sense contact pair and a fourth force and sense contact pair disposed along the second line, which is perpendicular to the first line.

3. The Hall effect device of claim 1, wherein the sense contacts of both contact pair supply terminals and contact pair output terminals are configured to provide output signals proportional to a voltage potential at a respective sense contact.

4. The Hall effect device of claim 1, wherein the force contact of respective force and sense contact pairs is disposed closer to the perimeter of the Hall effect device than the sense contact of the force and sense contact pair.

5. The Hall effect device of claim 1,
where a first space between sense contacts disposed along the first line is smaller than a second space between force contacts disposed along the first line; and
where a third space between sense contacts disposed along the second line is smaller than a fourth space between force contacts disposed along the second line.

6. The Hall effect device of claim 1, further comprising
an adaptive control unit configured to control a reference potential value associated with respective feedback circuits of the Hall effect device using an adaptive control technique, wherein respective feedback circuits of the Hall effect device drive the voltage potential at respective force and sense contact pair to the reference potential.

7. A Hall effect device, comprising:
a first sense contact and a second sense contact disposed along a first line between a first force contact configured to receive a first input voltage value and a second force contact configured to receive a second input voltage value different than the first input voltage value;
a third sense contact and a fourth sense contact disposed along a second line intersecting the first line at a position between a third force contact configured to receive a third input voltage value and a fourth force contact configured to receive a fourth input voltage value different than the third input voltage value;
wherein the sense contacts are configured to provide an output signal indicative of a magnetic field acting on the Hall effect device.

8. The Hall effect device of claim 7, further comprising:
one or more feedback circuits coupled to one or more of the plurality of force and sense contact pairs, respective feedback circuits configured to generate a feedback signal that controls a voltage potential at a coupled sense contact,
wherein the one or more feedback circuits comprise a high impedance feedback circuit input node coupled to one or more sense contacts and a feedback circuit output node coupled to one or more force contacts.

9. The Hall effect device of claim 8, wherein respective feedback circuits, comprise:
a transconductance input stage having a first input node configured to receive an input signal from the one or more sense contacts, a second input node configured to receive a reference signal, and an output node configured to output a current proportional to the voltage difference between the first and second input nodes; and
a current controlled current source configured to receive the output signal and to generate a feedback current based thereupon that is provided to the one or more force contacts associated with the one or more sense contacts.

10. The Hall effect device of claim 8, wherein the one or more feedback circuits comprise:
first and third feedback circuits respectively coupled to spatially opposed first and third contact pairs, the first and third feedback circuits configured to generate first and third feedback currents that establish a first and third potentials at opposed first and third sense contacts.

11. The Hall effect device of claim 10, wherein the one or more feedback circuits further comprise:
second and fourth feedback circuits respectively coupled to spatially opposed second and fourth contact pairs, the second and fourth feedback circuits configured to generate second and fourth feedback currents that establish an equal voltage potential at second and fourth sense contacts,
wherein the difference between the second and fourth feedback currents is essentially linearly dependent of the magnetic field acting on the Hall effect device.

12. The Hall effect device of claim 10, further comprising
a differential feedback circuit coupled to spatially opposed second and fourth contact pairs, the differential feedback circuit having an input configured to receive a voltage potential difference between second and fourth sense contacts and an output configured to provide a differential feedback current that reduces the potential difference between the second and fourth sense contacts.

13. The Hall effect device of claim 10, further comprising:
a common-mode feedback circuit coupled to spatially opposed second and fourth contact pairs, the common-mode feedback circuit having an input configured to receive a summation of the voltage potential at second and fourth sense contacts and further having an output configured to provide a common-mode feedback current that drives the potential difference between the second and fourth sense contacts to be equal to the sum of the voltage potential at the second and fourth sense contacts divided by two.

14. The device of claim 8, wherein the one or more feedback circuits comprise:
a dedicated source-feedback circuit configured to generate a first voltage potential at a first sense contact of the Hall effect device;
a dedicated sink-feedback circuit configured to generate a second voltage potential at a third sense contact spatially opposed to the first sense contact, wherein the second voltage potential is smaller than the first voltage potential;
a differential feedback circuit configured to generate a voltage potential of substantially zero on opposing second and forth sense contacts orthogonal to the first and third sense contacts;
a common-mode feedback circuit configured to generate a common-mode voltage potential on the second and forth sense contacts, which is smaller than the first voltage potential and larger than the second voltage potential; and
a switch matrix configured to connect the one or more of feedback circuits to the force and sense contact pairs according to a sequence of clock cycles.

15. The hall effect device of claim 8, further comprising:
an adaptive control unit configured to control reference potentials associated with the one or more feedback circuits using an adaptive control technique, wherein respective feedback circuits of the Hall effect device drive the voltage potential at a coupled force and sense contact pair to the associated reference potential.

16. The device of claim 7, wherein contact pairs comprising the force and separate sense contacts allow for measurement of an induced Hall voltage to be performed between two output terminals comprising opposing sense contacts using a high impedance voltage measurement circuit, thereby reducing the effect of contact resistance on the measurement.

17. The Hall effect device of claim 1,
wherein the first plurality of force and sense contact pair comprise a first even number of sense contacts having centers symmetrically disposed around a center point at distinct angular positions separated by angles equal to 360° divided by the even number; and
wherein the first plurality of force and sense contact pair comprise the first even number of force contacts having centers symmetrically disposed around the center point at the distinct angular positions.

18. The Hall effect device of claim 1,
wherein the first plurality of force and sense contact pair comprise a first sense contact and a second sense contact disposed along the first line at positions between a first force contact and a second force contact; and
wherein the second plurality of force and sense contact pair comprise a third sense contact and a fourth sense contact disposed along the second line at positions between a third force contact and a fourth force contact.

19. A Hall effect device, comprising:
a conductive substrate having a first doping type;
one or more tubs disposed within the conductive substrate and having a second doping type different than the first doping type;
a first sense contact pair disposed along a first line at a first position between a first force contact and a second force contact;
a second sense contact pair disposed along a second line, intersecting the first line, at a second position between a third force contact and a fourth force contact;
wherein respective force contacts are configured to provide electrical energy to the Hall effect device and respective sense contacts are configured to provide an output signal from the Hall effect device; and
wherein the Hall effect device has a first number of the force contacts that is the same as a second number of the sense contacts.

20. The Hall effect device of claim 19,
wherein only two force contacts and two sense contacts intersect the first line; and
wherein only two force contacts and two sense contacts intersect the second line.

\* \* \* \* \*